United States Patent
Kimmich

(10) Patent No.: US 7,054,158 B2
(45) Date of Patent: May 30, 2006

(54) COOLING BODY

(75) Inventor: Peter Kimmich, Schoenaich (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/509,661

(22) PCT Filed: Mar. 18, 2003

(86) PCT No.: PCT/DE03/00868

§ 371 (c)(1),
(2), (4) Date: Sep. 29, 2004

(87) PCT Pub. No.: WO03/107418

PCT Pub. Date: Dec. 24, 2003

(65) Prior Publication Data

US 2005/0162826 A1    Jul. 28, 2005

(30) Foreign Application Priority Data

Jun. 12, 2002  (DE) ................. 102 25 993

(51) Int. Cl.
*H05K 7/20* (2006.01)
(52) U.S. Cl. .......... 361/704; 361/707; 165/80.3; 165/185; 257/718; 257/727
(58) Field of Classification Search .......... 361/690, 361/697, 704, 707, 719; 257/718, 719, 727; 174/16.1, 16.3; 165/80.3, 104.33, 185
See application file for complete search history.

(56) References Cited

U.S. PATENT DOCUMENTS

| | | | |
|---|---|---|---|
| 4,845,590 A | | 7/1989 | Mikolajczak |
| 5,883,782 A | * | 3/1999 | Thurston et al. ............ 361/704 |
| 5,883,783 A | * | 3/1999 | Turturro ...................... 361/704 |
| 6,046,905 A | * | 4/2000 | Nelson et al. ............... 361/704 |
| 6,049,459 A | * | 4/2000 | Edmonds et al. ........... 361/707 |
| 6,337,796 B1 | | 1/2002 | Yamada et al. |
| 6,373,703 B1 | * | 4/2002 | Johnson et al. ............. 361/704 |
| 6,381,136 B1 | | 4/2002 | Nelson et al. |
| 6,469,893 B1 | * | 10/2002 | Frutschy et al. ............ 361/700 |
| 6,504,712 B1 | * | 1/2003 | Hashimoto et al. ......... 361/687 |
| 2001/0005312 A1 | | 6/2001 | Johnson et al. |

FOREIGN PATENT DOCUMENTS

| | | |
|---|---|---|
| GB | 2 163 598 A | 2/1986 |
| GB | 2163598 A  * | 2/1986 |

OTHER PUBLICATIONS

Patent Abstract of Japan 06163768 A, Jun. 10, 1994.
Patent Abstract of Japan 2001332670, Nov. 22, 2001.
Patent Abstract of Japan 2001250895, Sep. 14, 2001.
Patent Abstract of Japan 9326457 A2, Dec. 16, 1997.

* cited by examiner

*Primary Examiner*—Boris Chervinsky
(74) *Attorney, Agent, or Firm*—Michael J. Striker

(57) ABSTRACT

The present invention relates to a heat sink (1) with a main body (2) for accommodating at least one electronic structural element (5), and with a spring element (3) for pressing the structural element (5) against the main body (2), whereby the spring element (3) is held on the main body (2) by a connecting means. It is provided that the connecting means are configured as a push-on connection (15) and have a projection (7) on the main body (2) and a mounting opening (14) in the spring element (3) for the projection (7), whereby the opening edge (23) of the mounting opening (14) bears, at least in sections, against the lateral surface of the projection (7) under preload resulting from the intrinsic elasticity of the spring element (3) and/or the projection (7).

8 Claims, 3 Drawing Sheets

COOLING BODY

The present invention relates to a heat sink with a main body for accommodating at least one electronic structural element, and with a spring element for pressing the structural element against the main body, whereby the spring element is held on the main body by a connecting means.

BACKGROUND INFORMATION

Heat sinks of the type discussed here are known. They are used to absorb the heat dissipated from semiconductors in electronic circuits. To this end, the semiconductor is pressed onto a main body of the heat sink by a spring element. The spring element itself is held on the main body by latching into undercuts in the main body or being staked in a recess of the main body. Due to these previous means of fastening the spring element to the main body, the known heat sinks are relatively costly to manufacture.

SUMMARY OF THE INVENTION

In contrast to the related art, the heat sink according to the invention has the advantage that it is easier and more economical to manufacture. This is due to the fact that, given the configuration of the connecting means as a push-on connection having a projection on the main body, a main body shape is created that can be easily manufactured using an extrusion method (e.g., by joining). This is also due to the fact That, by configuring a mounting opening for the projection on The spring element, the opening edge of which bears, at least in sections, against the lateral surface of the projection under preload resulting from the intrinsic elasticity of the spring element and/or the projection, a spring element having a simple configuration can be provided. In terms of the push-on connection, an essential inventive idea is to utilize a property coming from the material of the spring element and/or the projection, namely the intrinsic elasticity, to produce the preload. Costly configurations of the spring element for producing a holding force on the projection can be avoided.

According to one embodiment of the present invention, configuration of the spring element is provided that is particularly simple and economical to manufacture.

According to one embodiment of the present invention, the advantage that the structural element is acted upon at a defined paint in a reproducible manner is created.

According to a further development, a heat sink is created, the spring element—for applying the preload, and in the state in which it acts on the structural element—of which has an elastic deflection located between the mounting opening and the contact point for the structural element. The state of acting upon the structural element is brought about by the mounting opening being pushed onto the projection and, in fact, to the point at which the elastic deflection in the spring element forms and is so great that the structural element is held on the main body by the bending force produced by the deflection. The spring element, which is configured as a leaf spring, functions quasi as a "bendable bar" along its longitudinal side, whereby the mounting opening is the fixing point of the "bendable bar". The bending force resulting from the elastic deflection of the spring element is now used not only to hold the structural element on the main body, but also to apply the preload. In terms of the application, "preload" is understood to be the force that, In the pushed-on state, acts on the projection and the mounting opening, i.e., on the push-on connection, and holds this connection together via the oblique position of the spring element resulting from the deflection and the associated pressing of the opening edge against the lateral surface of the projection.

According to a further embodiment, it is provided that the diameter of the mounting opening is greater than the associated diameter of the projection. As a result in the pushed-on state, depending on how much greater is the diameter of the mounting opening, an oblique position or at least the tendency toward an oblique position of the mounting opening and/or the opening edge acts on the projection. As a result of the oblique position, at least two contact points of the opening edge with the lateral surface of the projection are formed: i.e., an upper contact point and a lower contact point, as viewed in the longitudinal direction of the projection. In the pushed-on state, the opening edge is brought to bear against the projection via the contact points, and this holds the push-on connection together. A holding effect in the push-on connection is therefore brought about by the larger diameter of the mounting opening.

In terms of the application, the "diameter of the projection" and the "diameter of the mounting opening" are also understood to mean configurations having cross sections that are circular or that have another shape. For the mounting opening and the projection to have a shape of this type, it is not necessary for the mounting opening and the projection to have identical cross-sectional configurations.

According to a further embodiment, a heat sink is created, with which the preload is generated using a different principle. For this principle, the mounting opening has a diameter that, before the spring element is installed, is smaller than or equal in size on at least one point on the circumference of the mounting opening (referred to hereinbelow as the "mounting opening circumference") to the diameter of the projection at a point on the circumference of the projection (referred to hereinbelow as the "projection circumference") associated with this point. In the installed, i.e., pushed-on, state, the mounting opening and the projection now form a compression joint, that is, the opening edge is held via the interference fit against the lateral surface of the projection. In the case of this principle, the preload therefore results from a tension force that comes from the interference fit. It can also happen, however, that the preload results from the tension force and the bending force produced by the elastic deflection. The effects of both principles therefore overlap.

According to another embodiment, it is provided that the edge region of the mounting opening is provided with indentations to form spring tabs. The spring tabs provide the advantage that the mounting opening—as a result of the pushing-on motion—can be spread further apart, so that a greater lower deviation of the diameter of the mounting opening In the pre-installed state can be created. Since, as a result of the pushing-on motion, the spring tabs are bent radially outwardly against the direction of insertion, the advantage is also created that the push-on connection is prevented from coming loose, i.e., there is a safeguard against it slipping back off.

At the points that bear against the lateral surface of the projection in the installed state, the mounting opening edge can exert a force on the projection that is so great that a plastic material deformation is produced at these points (which form a contact zone) of the projection, and the contact zone is therefore configured as a plastic material deformation zone. The material deformation zone can be formed by notches, which are produced by the spring tabs "digging in". By way of the plastic material deformation zone, it is possible to prevent the push-on connection from coming loose or sliding off, due to the creation of a form-fit connection between the mounting opening and the projection.

Further advantageous configurations of the present invention result from the rest of the features, which are stated in the subclaims.

BRIEF DESCRIPTION OF THE DRAWINGS

The present invention is explained below in greater detail in various exemplary embodiments with reference to the associated drawing.

DETAILED DESCRIPTION OF THE PREFERRED EMBODIMENTS

Figure 1:
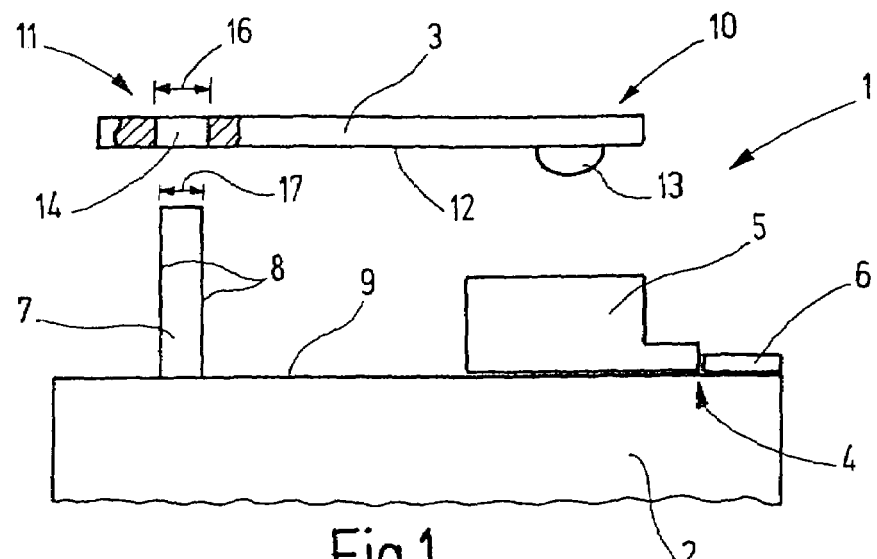
FIG. 1 shows a side view of a heat sink with a projection and a spring element, before installation of the spring element.

FIG. 1 shows, in a schematic representation, a heat sink 1 with a main body 2 and a spring element 3, before installation of spring element 3. Main body 2 has a receptacle 4 for accommodating an electronic structural element 5. Receptacle 4 of main body 2 contains a stop 6 for positioning structural element 5. Main body 2 further includes a projection 7 which extends, with its longitudinal side 8, at an angle of 90° and/or at an angle of essentially 90° to a top side 9 of main body 2. Spring element 3, which is configured as a leaf spring in the form of a flat spring, has a first end region 10 and a second end region 11, as viewed longitudinally. On its side 12 facing main body 2, first end region 10 contains a contact point 13 for electronic structural element 5.

In this exemplary embodiment, contact point 13 is configured as a projecting element opposite side 12 of spring element 3. The projecting element can be formed via material deformation of first end region 10 using a joining method. It is also possible for the projecting element to be formed by a weld point or soldering point, or the like.

Second end region 11 has a mounting opening 14 for projection 7. Mounting opening 14 is formed as a through-opening, whereby the sides of the through-opening toward side 12 of spring element 3 form an angle of 90° and/or essentially 90°. In this exemplary embodiment, diameter 16 of mounting opening 14 is greater than diameter 17 of projection 7.

Figure 2:
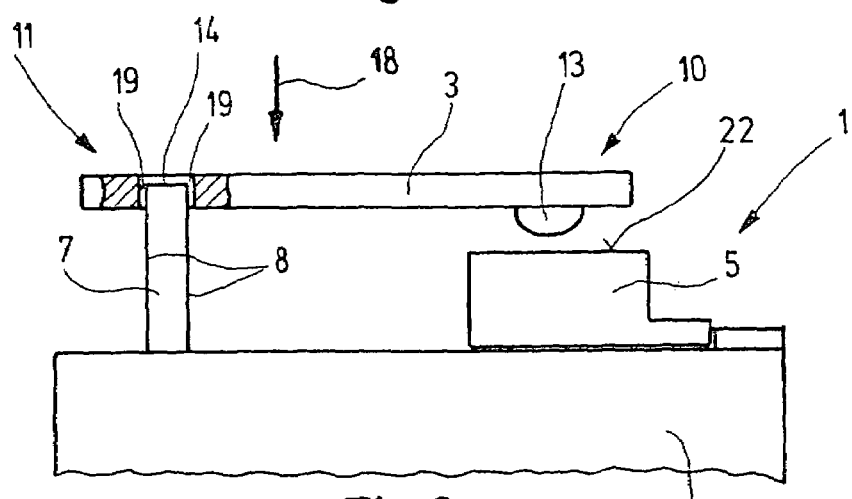
FIG. 2 shows a side view of the heat sink according to FIG. 1 during installation of the spring element.

When spring element 3 is installed, as shown in FIG. 2, mounting opening 14 is pushed onto projection 7 in the direction of arrow 18. In this exemplary embodiment, the act of "pushing on" can be carried out in simple fashion, since, given that diameter 16 of mounting opening 14 is greater than diameter 17 of projection 7, play 19 exists as long as spring element 3 is held in a position that is essentially at a right angle to projection 7 while being pushed on.

Figure 3:
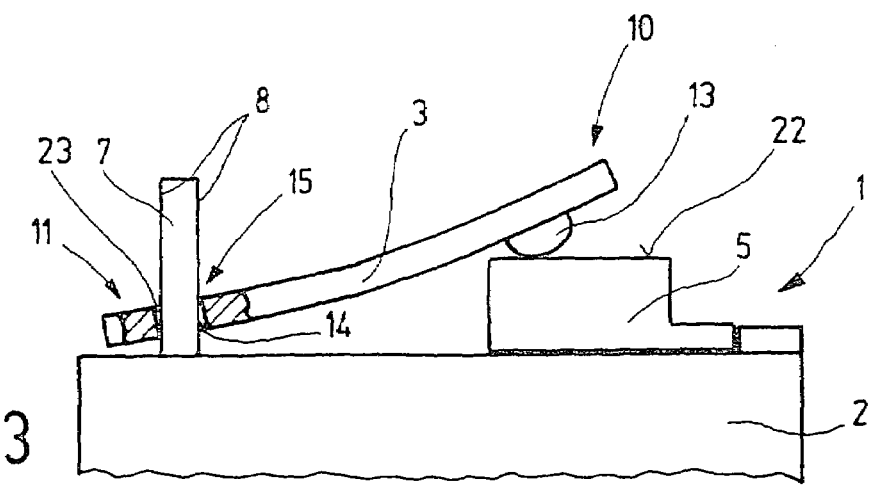
FIG. 3 shows a side view of the heat sink according to FIG. 1, after installation of the spring element.

As shown in FIG. 3, as a result of the continued pushing-on motion of spring element 3 in the direction of arrow 18, contact point 13 comes to bear against top side 22 of structural element 5, and spring element 3 deflects between contact point 13 and mounting opening 14. As a result of the deflection, furthermore, mounting opening 14 becomes inclined relative to longitudinal extension 8 of projection 7, so that opening edge 23 of mounting opening 14 clamps against lateral surface of projection 7, at least in sections, that is, at least in one section. In this position of spring element 3, mounting opening 14 and projection 8 are clamped with each other, whereby the spring element is simultaneously pressed via contact point 13 onto structural element 5 and holds it in its position. Mounting opening 14 and projection 7 therefore form, in this manner, a push-on connection 15 which holds spring element 3 against main body 2. The preload in push-on connection 15 results from the deflection of spring element 3.

Figure 4:
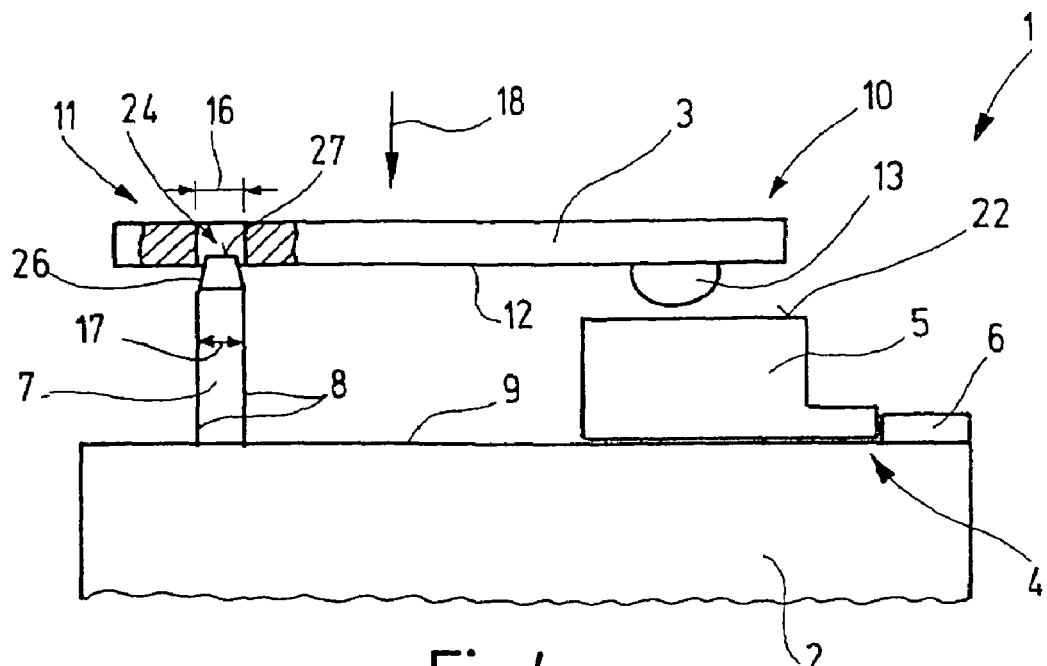
FIG. 4 shows a side view of the heat sink during installation of the spring element according to another exemplary embodiment.
Figure 5:
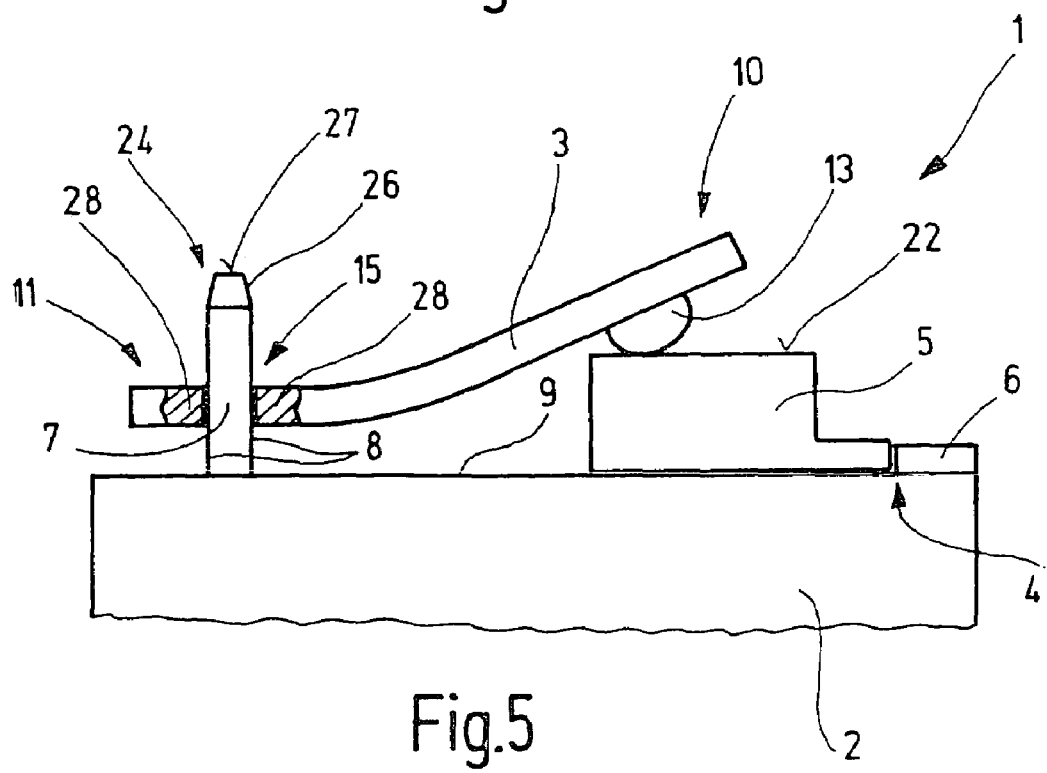
FIG. 5 shows a side view of the heat sink according to FIG. 4, after installation of the spring element.

Another exemplary embodiment of heat sink 1 is shown in FIGS. 4 and 5. Parts that correspond with parts in the exemplary embodiment in the previous figures are labeled with the same reference numerals. The exemplary embodiment in FIGS. 4 and 5 differs from the exemplary embodiment in FIGS. 1 through 3 in that, before spring element 3 is installed, diameter 16 of mounting opening 14 is smaller than diameter 17 of projection 7, based on at least one circumferential section. Furthermore, projection 7 has a leading bevel 26, so that diameter 17 of projection 7 on end face 27 of free end 24 is smaller than diameter 16 of mounting opening 14.

As shown in FIG. 4, spring element 3 is placed on leading bevel 26 with opening edge 23 of mounting opening 14. As a result of a push-on motion in the direction of arrow 18, mounting opening 14 is pushed onto projection 7, whereby an elastic deformation forms in edge region 28 of mounting opening 14, and mounting opening 14 widens. Mounting opening 14 is pushed onto projection 7 until contact point 13 comes in contact with structural element 5 and a deflection of spring element 3 is induced that is so great that an amount of contact pressure is produced which is sufficient to press structural element 5 against main body 2, as shown in FIG. 5. Due to the elastic deformation of mounting opening 14 in the circumferential section, which was smaller than diameter 17 of projection 7 before installation of spring element 3, the push-on motion brings about an interference fit between mounting opening 14 and projection 7 as a result of the elastic deformation, the interference fit resulting in the preload in push-on connection 15 in this exemplary embodiment. A push-on connection is therefore created which holds spring element 3 in the state in which it is acting upon structural element 5 using a simple frictional connection and which is secured against coming loose due to the preload, i.e., it has a quasi self-arresting function.

Due to the push-on motion, deformations on lateral surface 20 of projection 7 can occur in addition to the elastic deformations on the mounting opening 14. When the deformation forces are high, this deformation can have an elastic component and a plastic component. A plastic deformation of this type can result from opening edge 23 pressing into the sections adjacent to the lateral surface 20 of projection 7. It can also have resulted from a "bead formation" caused by opening edge 23 as a result of the push-on motion on projection 7.

Figure 6:
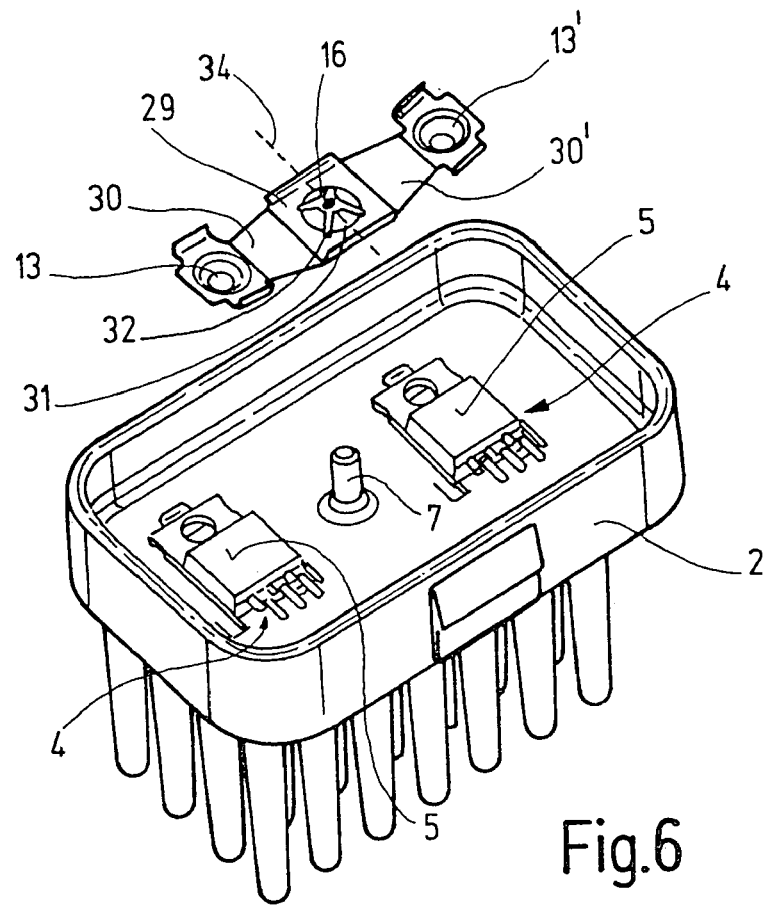
FIG. 6 shows a three-dimensional view of the heat sink before installation of the spring element, according to a further exemplary embodiment.
Figure 7:
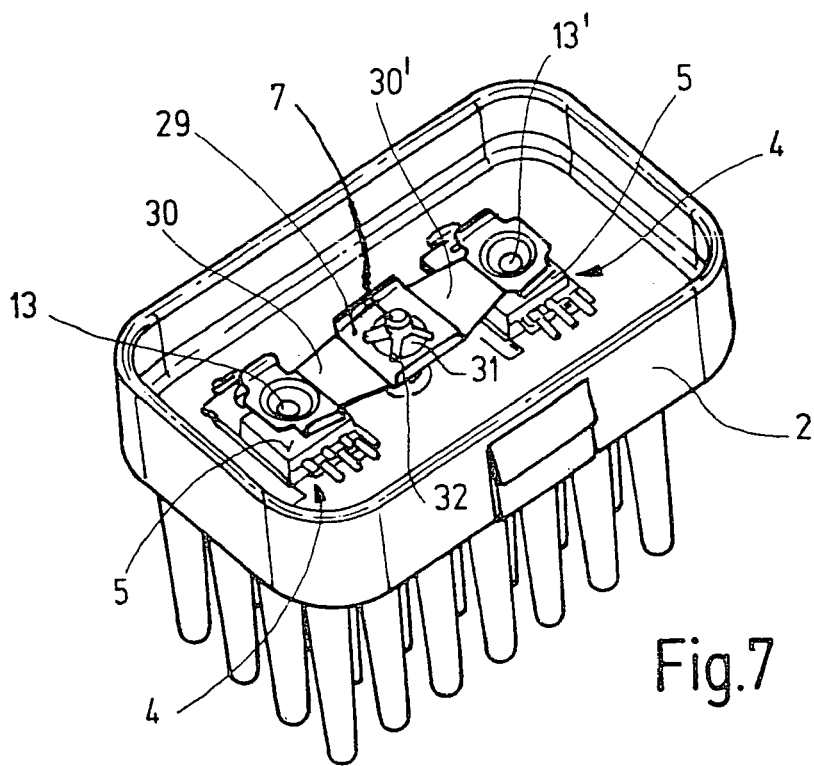
FIG. 7 shows a three-dimensional view of the heat sink according to FIG. 6, after installation of the spring element.

FIGS. 6 and 7 show heat sink 1 in a further exemplary embodiment, whereby, in FIG. 6, heat sink 1 is shown before installation of spring element 3, and, in FIG. 7, heat sink 1 is shown after installation of spring element 3. Parts that correspond to the parts in the exemplary embodiments in the previous FIGS. 1 through 5 are labeled with the same reference numerals.

Projection 7 is configured as a circular cylindrical peg and is fastened to main body 2 in an integral manner. Main body 2 has two receptacles 4 for accommodating two structural elements 5. Accordingly, spring element 3 has two contact points 13 and 13', so that one contact point 13, 13' each is allocatable to each structural element 5, whereby more than two structural elements can be allocated to the spring element. Contact points 13, 13' each form one end of spring element 3, which is a symmetrically configured component relative to its transverse axis 34.

Spring element 3 further has a center part 29 in which mounting opening 14 is located. Center part 29 is joined with the particular contact point 13, 13' via an intermediate part 30 and 30'. The particular contact point 13, 13' is located on the particular intermediate part 30, 30' and, in turn, the particular intermediate part 30, 30' is located on center part 29, each in a predetermined angular position such that spring element 3, in the state in which it acts on structural element 5, presses on top side 9 of structural element 5 only via contact point 13, 13', as shown in FIG. 7.

Mounting opening 14, which has a circular cross section in this exemplary embodiment, has a plurality of indentations 32 for forming spring tabs 31 in edge region 28. As shown in the exemplary embodiment according to FIGS. 4 and 5, diameter 16 of mounting opening 14 is smaller than the diameter of circular cylindrical peg 7 before spring element 3 is installed. As a result of the push-on motion, spring tabs 31 are bent radially outwardly, opposite the push-on direction in accordance with arrow 18, so that a self-arresting push-on connection is created as a result, i.e., the push-on connection is "blocked" from coming loose on its own, due to the deformed spring tabs.

With this exemplary embodiment, it is also possible, of course, that, depending on the configuration, the push-on connection functions not only in a non-positive manner, but also in a form-locked manner, e.g., by spring tabs 31 digging into circular cylindrical peg 7, with the formation of notches, therefore plastically deforming said circular cylindrical peg in the digging-in region.

What is claimed is:

1. A heat sink with a main body for accommodating at least one electronic structural element, and with a spring element for pressing the structural element against the main body, whereby the spring element is held on the main body by a connecting means,
    wherein, the connecting means are configured as a push-on connection (15) and have a projection (7) on the main body (2) and a mounting opening (14) in the spring element (3) for the projection (7), whereby an opening edge (23) of the mounting opening (14) bears, at least in sections, against a lateral surface of the projection (7) under preload resulting from intrinsic elasticity of the spring element (3) and/or the projection (7), and wherein a diameter (16) of the mounting opening (14) is greater than an associated diameter (17) of the projection (7).

2. The heat sink as recited in claim 1, wherein the spring element (3) is designed as a leaf spring.

3. The heat sink as recited in claim 1, wherein the spring element (3) has at least one contact point (13) for the structural element (5).

4. The heat sink as recited in claim 3, wherein the spring element (3), when acting on the structural element (5), has an elastic deflection located between the mounting opening (14) and the at least one contact point (13) for applying the preload.

5. The heat sink as recited in claim 1, wherein, before the spring element (3) is installed, the diameter (16) of the mounting opening (14)—at at least one point on a circumference of the mounting opening—is smaller than or equal in size to the diameter (17) of the projection (7) at a point of a circumference of the projection associated with said point.

6. The heat sink as recited in claim 1, wherein a contact zone on the projection (7) is a plastic material deformation zone.

7. The heat sink as recited in claim 1, wherein the projection (7) and the main body (2) are an extruded part.

8. The heat sink as recited in claim 1, wherein the projection (7) is designed as a circular cylindrical peg, and the mounting opening (14) has a circular cross section.

* * * * *